United States Patent [19]

Chhabra

[11] Patent Number: 5,024,599

[45] Date of Patent: Jun. 18, 1991

[54] SEMICONDUCTOR PROCESSING APPARATUS FOR CREATING BACK PRESSURE WITHIN A QUARTZ FURNACE TUBE

[75] Inventor: Navjot Chhabra, Boise, Id.

[73] Assignee: Micron Technology, Inc., Boise, Id.

[21] Appl. No.: 513,557

[22] Filed: Apr. 24, 1990

[51] Int. Cl.⁵ .............................................. F24J 3/00
[52] U.S. Cl. .................................. 432/226; 432/249; 432/253; 432/17
[58] Field of Search .................. 432/226, 5, 6, 253, 432/152, 249, 17

[56] References Cited

U.S. PATENT DOCUMENTS

| | | | |
|---|---|---|---|
| 4,355,974 | 10/1982 | Lee | 432/5 |
| 4,911,638 | 3/1990 | Bayne et al. | 432/253 |
| 4,925,388 | 5/1990 | Iseki et al. | 432/253 |

Primary Examiner—Henry C. Yuen
Attorney, Agent, or Firm—Wells, St. John & Roberts

[57] ABSTRACT

Disclosed is a semiconductor processing furnace flow restricting apparatus for insertion into a longitudinally elongated semiconductor wafer processing furnace to create back pressure to increase residence time of processing gases within the furnace. The apparatus comprises:

at least two ring-like members, one of the ring-like members being concentrically mounted inside the other, the ring-like members each having a fore longitudinal end and an aft longitudinal end, the two ring-like members each having a varying diameter which tapers inwardly from the fore longitudinal end to the aft longitudinal end; and a lower mounting assembly having a male fitting cross sectional size and shape which is complementary to an upward female size and shape of the elongated wafer paddle, the male shape of the mounting assembly being supportable within the female shape of the wafer paddle to laterally position the two rings when the paddle and apparatus are received within a semiconductor wafer processing furnace.

9 Claims, 1 Drawing Sheet

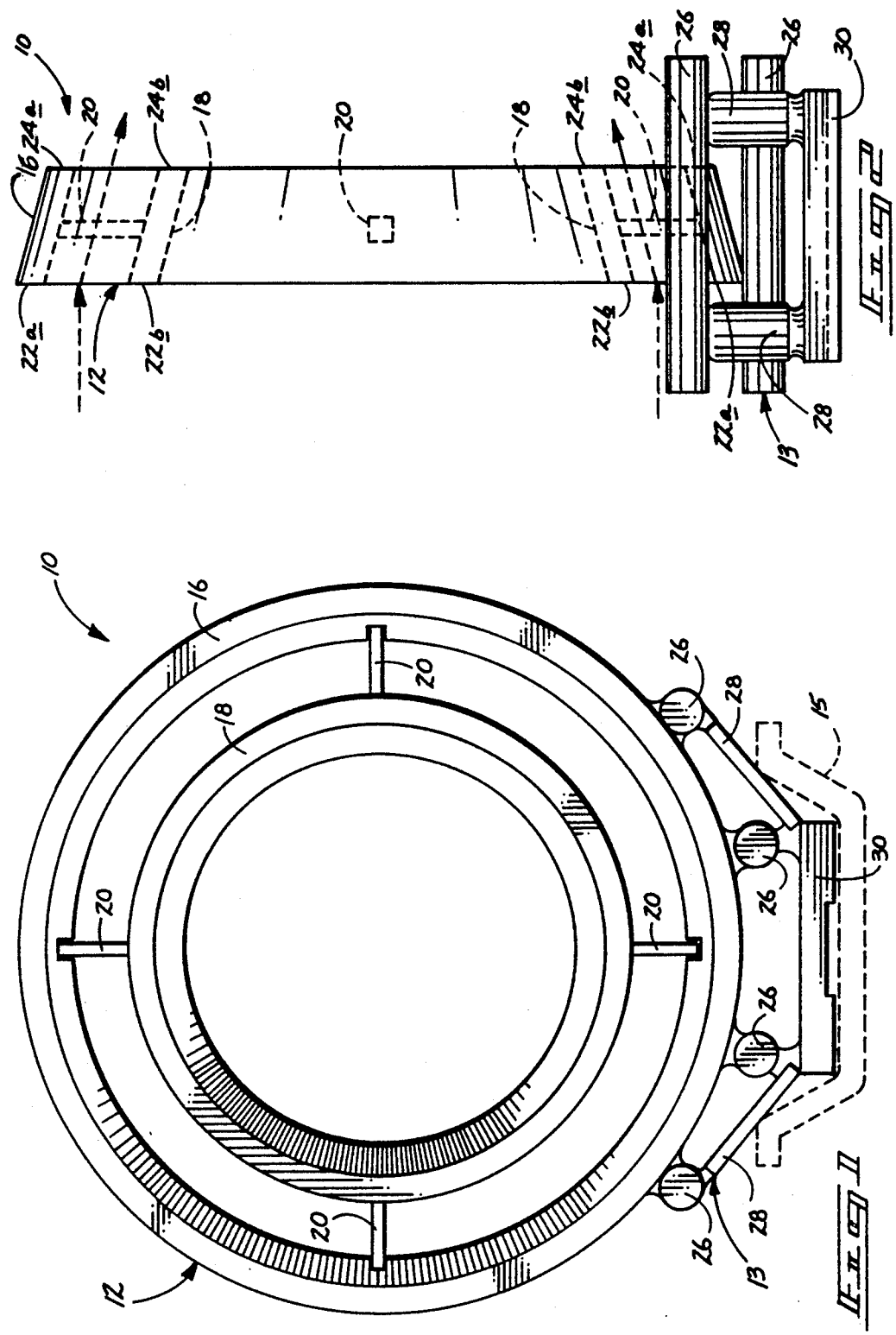

SEMICONDUCTOR PROCESSING APPARATUS FOR CREATING BACK PRESSURE WITHIN A QUARTZ FURNACE TUBE

TECHNICAL FIELD

This invention relates generally to processing of semiconductor wafers in processing furnaces, and more particularly to restricting the flow of processing gases through such furnaces to increase the residence time of gases within the furnace.

BACKGROUND OF THE INVENTION

One type of semiconductor processing furnace is in the shape of an elongated hollow tube having electric coils wrapped therearound. Replaceable quartz tubes having diameters just slightly less than the internal diameter of the furnace are placed inside the furnaces. One end of the furnace and tube are provided with an opening for a gas injector system for injecting the processing gases into the tube within the furnace during treatment.

Semiconductor wafers are supported within the furnace for processing on an elongated silicon carbide wafer paddle which is defined by an elongated well having upwardly rising and outwardly flaring sides. The wafers are supported vertically on such paddle, typically on wafer cassettes, made of quartz which are mounted on the elongated wafer paddle. Gases are injected into one end of the furnace and flow outwardly through the furnace to treat the wafers, and are exhausted from the opposite furnace end.

One of the concerns associated with processing semiconductor wafers in such furnaces is to provide sufficient exposure of all of the closely stacked wafers to the injected gas. However, the configuration of the furnace in relation to the position of the stacked wafers tends to cause gas to stream down the side of the internal furnace walls, and not uniformly access in between the adjacently stacked wafers. One such method of facilitating injection of gases between the wafers is to provide a baffle in the quartz tube downstream of the injector nozzle to cause turbulence and diffusion. This minimizes the tendency of the gas to stream down the walls of the furnace tube.

This invention concerns another way of increasing the exposure of the wafers to processing gases within such reactor furnaces.

BRIEF DESCRIPTION OF THE DRAWINGS

The preferred embodiment of the invention is illustrated in the accompanying drawings, in which:

FIG. 1 is a front longitudinal end view of a semiconductor processing furnace flow restricting apparatus in accordance with the invention.

FIG. 2 is a side elevational view of the apparatus of FIG. 1.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

Referring to the figures, a semiconductor processing furnace flow restricting apparatus is indicated generally by reference numeral 10. Apparatus 10 is adapted for insertion into a longitudinally elongated semiconductor wafer processing furnace to create back pressure to increase residence time of processing gases within the furnace. Apparatus 10 is comprised of a ring-like section 12 and a lower supporting section 13. Section 13 provides a means for laterally supporting ring-like portion 12 within a longitudinally elongated semiconductor wafer processing furnace.

More particularly, ring-like portion 12 is comprised of first and second rings 16, 18 respectively. Second ring 18 is concentrically supported within first ring 16 by a series of four supports 20 which engage and extend between the first and second rings at 90° intervals. First and second ring members 16, 18 have fore ends 22a, 22b respectively, and aft ends 24a, 24b respectively. Each of first and second ring 16, 18 has a varying diameter along its longitudinal length which tapers inwardly from the respective fore longitudinal end 22a, 22b to the respective aft longitudinal end 24a, 24b.

Lower support or mounting assembly 13 is of a male fitting cross sectional size and shape which is complementary to the upwardly concave female size and shape of an elongated wafer paddle 15 which would support wafers for processing. The male shape of lower mounting assembly 13 will fit within and be supportable on wafer paddle 15 to laterally position rings 16 and 18 within the furnace tube. More particularly, lower mounting assembly 13 is similar in shape to a standard quartz cassette which would be mounted on a silicon carbide wafer paddle for supporting wafers. Lower assembly 13 is comprised of four longitudinal rods 26 which are positioned to form a cradle for supporting first outer ring 16 of ring-like portion 12. Two pairs of laterally oriented and longitudinally spaced supports 28 interconnect and support rods 26. Supports 28 and the lower two of rods 26 mount relative to a flat base 30. As illustrated in FIG. 1, lower mounting assembly 13 will be cradled by and supported within paddle 15. All components of apparatus 10 are preferably made of quartz.

In operation, flow restricting apparatus 10 would be positioned within a paddle at the rear portion of the paddle to be positioned at the rear of the furnace. Rings 16 and 18 cause gases flowing along the sides of the inner furnace walls to be directed inwardly, thus creating a back pressure. The back pressure ultimately restricts flow, thus increasing the pressure and residence time of the gases within the furnace. This serves to increase the exposure of wafers within the furnace to processing gases.

In compliance with the statute, the invention has been described in language more or less specific as to structural features. It is to be understood, however, that the invention is not limited to the specific features shown and described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. A semiconductor processing furnace flow restricting apparatus for insertion into a longitudinally elongated semiconductor wafer processing furnace to create back pressure and minimize streamlining flow of gas longitudinally along internal walls of the furnace to increase residence time of processing gases within the furnace, the apparatus comprising:

at least two ring-like members, one of the ring-like members being mounted inside the other, the ring-like members each having a fore longitudinal end and an aft longitudinal end, at least one of the ring-like members having a varying diameter which tapers inwardly between the fore longitudinal end and the aft longitudinal end to create back pressure and restrict gas flow longitudinally through the furnace; and means for laterally supporting the two ring-like members within a longitudinally elongated semiconductor wafer processing furnace.

2. The semiconductor processing furnace flow restricting apparatus of claim 1 wherein the two ring-like members are supported concentrically relative to one another.

3. The semiconductor processing furnace flow restricting apparatus of claim 1 wherein the one ring is supported relative to the other by supports which extend between the one and other at 90° intervals.

4. The semiconductor processing furnace flow restricting apparatus of claim 1 wherein, the two ring-like members are supported concentrically relative to one another; and the one ring is supported relative to the other by supports which extend between the one and other at 90° intervals.

5. The semiconductor processing furnace flow restricting apparatus of claim 1 wherein semiconductor wafers to be supported within the furnace are supported on an elongated wafer paddle for sliding wafers into and out of the furnace, the wafer paddle being defined by an elongated well having upwardly rising sides, and wherein the means for supporting the two ring-like members laterally within a longitudinally elongated semiconductor wafer processing furnace comprises:

a lower mounting assembly having a male fitting cross sectional size and shape which is complementary to an upward female size and shape of the elongated wafer paddle, the male shape of the mounting assembly being supportable within the female shape of the wafer paddle to laterally position the two rings when the paddle and apparatus are received within a semiconductor wafer processing furnace.

6. The semiconductor processing furnace flow restricting apparatus of claim 5 wherein the two ring-like members are supported concentrically relative to one another.

7. The semiconductor processing furnace flow restricting apparatus of claim 5 wherein the one ring is supported relative to the other by supports which extend between the one and other at 90° intervals.

8. The semiconductor processing furnace flow restricting apparatus of claim 5 wherein, the two ring-like members are supported concentrically relative to one another; and the one ring is supported relative to the other by supports which extend between the one and other at 90° intervals.

9. A semiconductor processing furnace flow restricting apparatus for insertion into a longitudinally elongated semiconductor wafer processing furnace to create back pressure and minimize streamlining flow of gas longitudinally along internal walls of the furnace to increase residence time of processing gases within the furnace, the apparatus comprising:

at least two ring-like members, one of the ring-like members being mounted inside the other, the ring-like members each having a fore longitudinal end and an aft longitudinal end, the two ring-like members each having a varying diameter which tapers inwardly between the fore longitudinal end and the aft longitudinal end to create back pressure and restrict gas flow longitudinally through the furnace; and means for laterally supporting the two ring-like members within a longitudinally elongated semiconductor wafer processing furnace.

* * * * *